United States Patent
Virnich et al.

(10) Patent No.: US 10,126,149 B2
(45) Date of Patent: Nov. 13, 2018

(54) CAPACITIVE OCCUPANCY OR PROXIMITY DETECTOR

(71) Applicant: IEE International Electronics & Engineering S.A., Echternach (LU)

(72) Inventors: Michael Virnich, Korlingen (DE); Michael Pütz, Trier (DE); Laurent Lamesch, Reichlange (LU); Jochen Landwehr, Trier (DE)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 15/510,303

(22) PCT Filed: Aug. 20, 2015

(86) PCT No.: PCT/EP2015/069162
§ 371 (c)(1),
(2) Date: Mar. 10, 2017

(87) PCT Pub. No.: WO2016/037826
PCT Pub. Date: Mar. 17, 2016

(65) Prior Publication Data
US 2017/0299411 A1    Oct. 19, 2017

(30) Foreign Application Priority Data
Sep. 10, 2014 (LU) .......................... 92542

(51) Int. Cl.
*G01D 5/24* (2006.01)
*G01R 31/44* (2006.01)
(Continued)

(52) U.S. Cl.
CPC .............. *G01D 5/24* (2013.01); *B60N 2/002* (2013.01); *B60N 2/5685* (2013.01);
(Continued)

(58) Field of Classification Search
CPC . G01D 5/24; G01R 31/02; B62D 1/06; B60N 2/5685; B60N 2/002; B60R 21/01532; B60R 21/0154
(Continued)

(56) References Cited

U.S. PATENT DOCUMENTS 5,804,887 A    9/1998 Holzapfel et al.
2009/0295199 A1    12/2009 Kincaid et al.
(Continued)

FOREIGN PATENT DOCUMENTS

EP    0802093 A1    10/1997
EP    2085263 A1    8/2009
(Continued)

OTHER PUBLICATIONS

International Search Report for International application No. PCT/EP2015/069162, dated Dec. 9, 2015, 5 pages.
(Continued)

*Primary Examiner* — Patrick Assouad
*Assistant Examiner* — Khristopher Yodichkas
(74) *Attorney, Agent, or Firm* — Reising Ethington P.C.

(57) ABSTRACT

A capacitive occupancy or proximity detector includes a heating circuit, an impedance measurement circuit connected to the heating element, and a diagnostic circuit configured for determining integrity of the heater element. The heating circuit includes a heating element, a heating current source and a common mode choke having a first and a second winding, the heating element being connectable to the heating current source via the first and second windings. The diagnostic circuit includes at least one controllable switching element coupled across the second winding, circuitry for injecting a DC current into a series connection formed by the first winding the heating element and a parallel connection of the second winding and the at least
(Continued)

one controllable switching element, and at least one detection circuit for detecting a voltage variation across the second winding.

14 Claims, 1 Drawing Sheet

(51) Int. Cl.
| | |
|---|---|
| *G01R 31/02* | (2006.01) |
| *B60R 21/015* | (2006.01) |
| *B60N 2/56* | (2006.01) |
| *B60N 2/00* | (2006.01) |
| *B62D 1/06* | (2006.01) |

(52) U.S. Cl.
CPC .... *B60R 21/0154* (2014.10); *B60R 21/01532* (2014.10); *G01R 31/02* (2013.01); *G01R 31/44* (2013.01); *B62D 1/06* (2013.01)

(58) Field of Classification Search
USPC ........................................................ 324/658
See application file for complete search history.

(56) References Cited

U.S. PATENT DOCUMENTS

| | | |
|---|---|---|
| 2011/0121618 A1 | 5/2011 | Fischer et al. |
| 2013/0020305 A1* | 1/2013 | Lamesch ................ B60N 2/002 219/217 |
| 2014/0131344 A1* | 5/2014 | Lamesch ................ B60N 2/002 219/506 |

FOREIGN PATENT DOCUMENTS

| | | | |
|---|---|---|---|
| JP | 2013163413 A | 8/2013 | |
| WO | WO2012113795 A1 | 8/2012 | |
| WO | WO 2013007541 A1 * | 1/2013 | ............. B60N 2/002 |

OTHER PUBLICATIONS

Written Opinion for International application No. PCT/EP2015/069162, dated Dec. 9, 2015, 5 pages.

* cited by examiner

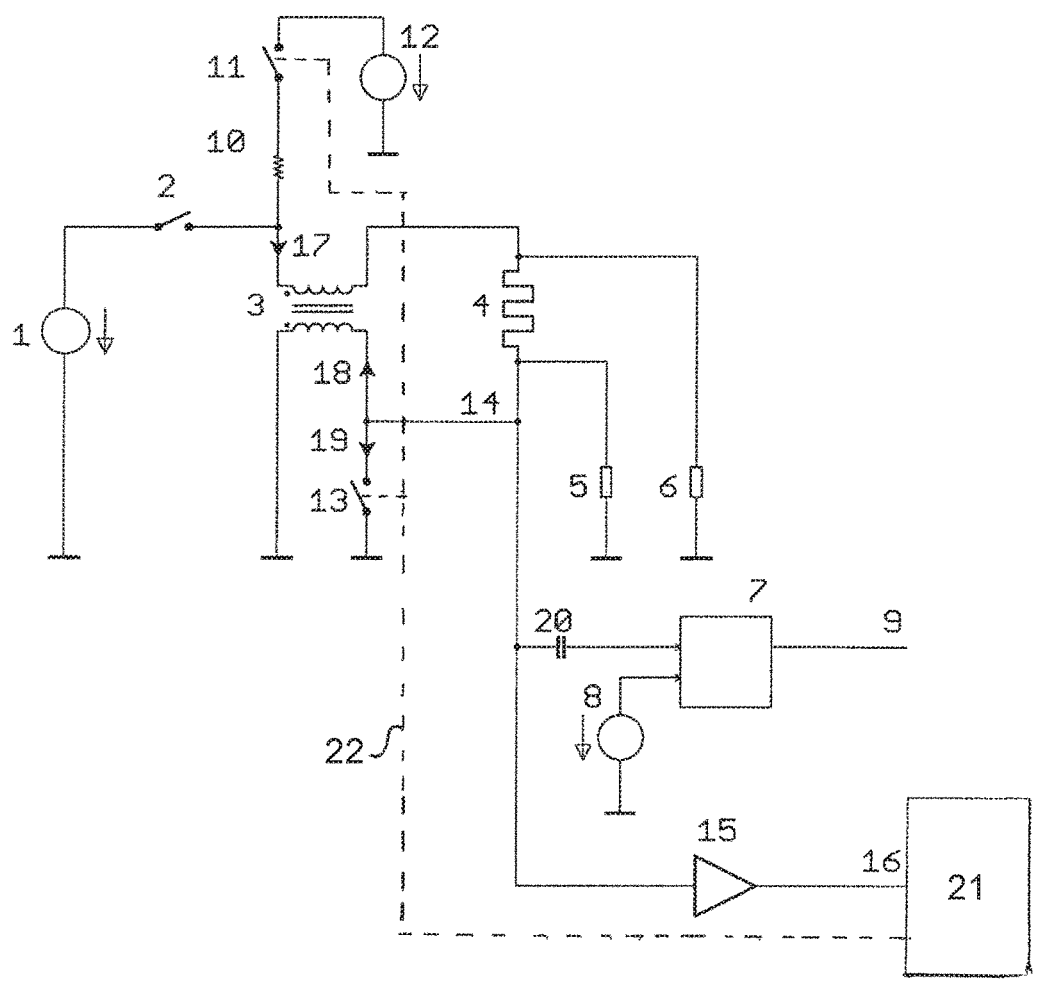

CAPACITIVE OCCUPANCY OR PROXIMITY DETECTOR

TECHNICAL FIELD

The present invention generally relates to a capacitive occupancy or proximity detector that can use a heating element as its antenna electrode. A capacitive occupancy or proximity detector as proposed herein may e.g. be used for detecting the absence or presence of an occupant on an occupiable item, which might be a vehicle seat, a hospital bed etc., or for detecting a driver's hand on the steering wheel.

BACKGROUND ART

A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode at which the influence of an object or living being on the electric field is detected. In some (so-called "loading mode") capacitive occupancy sensors, the one or more antenna electrodes serve at the same time as sensing electrodes. In this case, the measurement circuit determines the current flowing into the one or more antenna electrodes in response to an oscillating voltage being applied to them. The relationship of voltage to current yields the complex impedance of the one or more antenna electrodes. In an alternative version of capacitive sensors ("coupling mode" capacitive sensors), the transmitting antenna electrode(s) and the sensing electrode(s) are separate from one another. In this case, the measurement circuit determines the current or voltage that is induced in the sensing electrode when the transmitting antenna electrode is operating.

The different capacitive sensing mechanisms are explained in the technical paper entitled "Electric Field Sensing for Graphical Interfaces" by J. R. Smith, published in Computer Graphics I/O Devices, Issue May/June 1998, pp 54-60. The paper describes the concept of electric field sensing as used for making non-contact three-dimensional position measurements, and more particularly for sensing the position of a human hand for purposes of providing three-dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling. "Shunt mode" is alternatively referred to as the above-mentioned "coupling mode".

Capacitive occupant sensing systems have been proposed in great variety, e.g. for controlling the deployment of one or more airbags, such as e.g. a driver airbag, a passenger airbag and/or a side airbag. U.S. Pat. No. 6,392,542, to Stanley, teaches an electric field sensor comprising an electrode mountable within a seat and operatively coupled to a sensing circuit.

The idea of using the heating element of a seat heater as an antenna electrode of a capacitive occupancy sensing system has been known for a long time. WO 92/17344 A1 discloses a an electrically heated vehicle seat with a conductor, which can be heated by the passage of electrical current, located in the seating surface, wherein the conductor also forms one electrode of a two-electrode seat occupancy sensor.

U.S. Pat. No. 7,521,940 relates to a combined seat heater and capacitive sensor capable of operating, at a time, either in heating mode or in occupant-sensing mode. The device includes a sensor/heat pad for transmitting a sensing signal, a first diode coupled to a first node of the sensor/heat pad, a second diode coupled to a second node of the sensor/heat pad, a first transistor coupled to the first diode and a second transistor coupled to the second diode. During sensing mode, the first and second transistors are opened and the nodes between the first transistor and the first diode, as well as between the second transistor and the second diode are reverse-biased to isolate the sensor/heat pad from the power supply of the heating circuit.

U.S. 2009/0295199 discloses a combined seat heater and capacitive sensor, wherein each of the two nodes of the heating element is connected to the heating power supply via two transistors in series. The device may not operate in sensing mode and in heating mode at a time. When the device is in sensing mode, the nodes between each pair of transistors are actively kept at the same potential as the heating element by means of respective voltage followers in order to neutralize any open-switch impedance of the transistors.

The very same idea has already been disclosed in U.S. Pat. No. 6,703,845. As an alternative to transistors, that document discloses inductors to achieve a high impedance at the frequency of the oscillating signal between the heating element and the power source of the heating circuit. As in the previously discussed document, a voltage follower maintains the intermediate nodes substantially at the same potential as the heating element in order to effectively isolate, at the frequency of the oscillating signal, the power supply of the heating circuit from the heating element.

A disadvantage of the system disclosed in U.S. Pat. No. 6,703,845 is that the inductors used as AC-decoupling elements have to support the full heating current (up to 10 A DC and more) and present high AC impedance to the capacitive measurement circuit and the seat heater at the same time. High inductance and high operating DC current implies that the inductor have to be wound on large cores, which are expensive. Depending on the application chosen from U.S. Pat. No. 6,703,845, either two or four of these inductors have to be used.

U.S. 2011/121618 discloses yet another variant of an occupant detection system including a heating element adjacent the seating surface of a seat. A capacitive occupant detection circuit is electrically coupled to the heating element. A common mode choke is interposed between the heating circuit and the heating element as an isolation circuit that prevents the heating circuit from influencing the occupant detection circuit.

When capacitive occupancy or proximity detection systems use a heating element as the antenna electrode, the heating element potentially becomes a safety-relevant system component. It may thus be necessary to monitor the good functioning of the heating element in order to rule out a false reading by the capacitive occupancy or proximity detection system.

A solution to this problem may consist of measuring the heating current during heating operation, and measuring the heater resistance during heating pauses. This solution however requires a low shunt resistance to keep power dissipation low, which in turn requires the use of an expensive precision amplifier.

Technical Problem

It is an object of the present invention to provide a capacitive loading mode measurement circuit using a heater as sensor and a common mode choke as separator between the heating current and the measurement current with a low cost seat heater diagnostic circuit. This object is achieved by a capacitive occupancy or proximity detector as claimed in claim 1.

General Description of the Invention

A capacitive occupancy or proximity detector comprises a heating circuit, an impedance measurement circuit and a diagnostic circuit for checking the integrity of the device. The heating circuit includes a heating element (which may be a seat heater element to be integrated into a vehicle seat, a panel heater to be integrated into a panel surface or a steering wheel heater), a heating current source and a common mode choke having a first and a second winding, said heating element being connectable to said heating current source via said first and second windings of said common mode choke. The impedance measurement circuit is connected to the heating element for measuring impedance between said heating element and a node at ground potential (e.g. the vehicle chassis if the detector is arranged in a vehicle). The detector further comprises a diagnostic circuit configured for determining integrity of said heater element. According to an aspect of the invention, the diagnostic circuit comprises at least one first controllable switching element coupled across said second winding of said common mode choke, means for injecting a DC current into a series connection formed by said first winding of said common mode choke, said heating element and a parallel connection of said second winding of said common mode choke and said at least one first controllable switching element; and at least one detection circuit for detecting a voltage variation across said second winding of said common mode choke, said voltage variation being induced upon opening said first controllable switching element.

The heating element preferably comprises an ohmic heater, e.g. a wire made of resistive material or a resistive trace printed on a substrate. The heating element may be made of positive-temperature-coefficient (PTC) material, i.e. a material the electrical resistance of which increases with increasing current flowing across it.

In order to diagnose the seat heating circuit, the first controllable switch is closed and the diagnostic circuit causes a DC current to flow through the series connection of the different elements. The DC current thus flows through the first winding of common mode choke, through the heating element and divides at the parallel connection of said second winding of said common mode choke and said at least one first controllable switching element. A part of the current flows through the second winding of common mode choke and another part through the closed switch.

Due to the transformer action of common mode choke and the magnetic coupling factor between first and second windings of the common mode choke, the current flowing through the second winding will first be substantially equal to the injected DC current. As the inductance of the common mode choke windings is not infinite, the current through the second winding will decay with time and the current through the closed switch will rise correspondingly, such that the sum of both currents remains substantially equal to the injected DC current. After a certain settling time, the repartition of current between the second winding and the closed switch will be defined by the ratios of second winding DC resistance and switch 'on' resistance.

It the first controllable switching element is subsequently opened, the current through the switching element drops abruptly to a level of substantially zero, and accordingly the current through the second winding is abruptly increasing from its previous equilibrium level to the level of the injected DC current. This current step through the second winding generates an abrupt voltage variation or voltage pulse on a diagnostic node located upstream from the second winding of the common mode choke, i.e. between the second winding and the heating element. The presence of this voltage pulse, which can be detected by the detection circuit gives a clear indication that the heating element is intact. In fact, if the heating element is disconnected or broken, the injected DC current cannot flow and accordingly opening of the first controllable switching element does not generate a voltage pulse on the diagnostic node.

It will be appreciated that the presence of the voltage pulse may be detected by low cost circuitry and that the presently presented solution therefore enables the implementation of a low cost diagnostic circuit.

As will be appreciated, the proposed configuration allows a diagnosis of the heating circuit both while it is on, i.e. during a heating cycle, and while it is off, i.e. outside a heating cycle. In fact the means for injecting said DC current may comprise the heating current source, in which case the diagnostic circuit is configured for determining integrity of said heater element during a heating cycle of said heating element. In a variant, the means for injecting said DC current may comprise a diagnostic DC current source which is connected to said first winding of said common mode choke or connectable via a second controllable switching element to said first winding of said common mode choke. In this case the diagnostic circuit is configured for determining integrity of said heater element outside a heating cycle of said heating element.

In a possible embodiment the detection circuit comprises a microcontroller comprising an analog to digital conversion block and a corresponding analog to digital input, said analog to digital input being operatively connected to a diagnostic node located between said second winding of said common mode choke and said heating element. In this embodiment the microcontroller is further configured for comparing an amplitude of said voltage variation at said diagnostic node to a threshold value. If a voltage pulse is detected which exceeds the threshold value, the heating circuit is considered intact for the purpose of capacitive detection whereas in the absence of a voltage pulse exceeding the threshold, a circuit interruption is deemed to have occurred and a corresponding action (such as the issuing of a warning signal) may be triggered.

It will be appreciated that said detection circuit preferably further comprises an amplifier connected between said diagnostic node and said analog to digital input of said microcontroller, said amplifier for amplifying a voltage signal at said diagnostic node.

In a possible embodiment, the microcontroller is further configured for measuring an offset voltage at said analog to digital input when said first controllable switching element is closed and for subtracting the measured offset voltage from said voltage variation prior to the comparison with said threshold value.

Finally the microcontroller is preferably further configured for controlling operation of said at least one first controllable switching element and/or said at least one second controllable switching element.

A preferred aspect of the invention relates to a combined seat heater and seat occupancy sensor, comprising a capacitive occupancy or proximity detector as described hereinabove.

Another preferred aspect of the invention relates to a combined steering wheel heater and hands-on-detector, comprising a capacitive occupancy or proximity detector as described hereinabove.

According to a yet another aspect of the invention, a method for determining integrity of a heater element in a capacitive occupancy or proximity detector as described hereinabove, comprises the steps of:
a. controlling said at least one first controllable switching element to switch into a closed state;
b. causing a DC current to be injected into a series connection formed by said first winding of said common mode choke, said heating element and a parallel connection of said second winding of said common mode choke and said at least one first controllable switching element;
c. after a predetermined settling time, controlling said at least one first controllable switching element to switch into an open state;
d. upon opening said first controllable switching element, detecting a voltage variation across said second winding of said common mode choke; and
e. concluding that integrity of a heater element is given if said voltage variation exceeds a predetermined threshold value.

The present method thus consist of injecting a DC current into the series connection of the first winding of the common mode choke, the seat heater and the parallel connection of the second winding of the common mode choke and a switch connected across the second winding of the common mode choke, waiting a certain amount of time, then open the switch. The current which flowed through the switch before opening the switch now flows abruptly through the second winding of the common mode choke, and generates a voltage pulse across the second winding. This pulse is detected e.g. by an analog to digital converter of a microcontroller. If no seat heater is connected, or if it is broken and has an open circuit, the DC current will not flow, and no pulse will be detected.

The step of causing said DC current to be injected into a series connection may comprise causing said heating current source to supply a heating current to said heating element and/or connecting a diagnostic DC current source via a second controllable switching element to said first winding of said common mode choke.

In an embodiment of the method said detecting a voltage variation across said second winding of said common mode choke comprises detecting a variation of a voltage level at a diagnostic node located between said second winding of said common mode choke and said heating element. Furthermore the method preferably comprises the step of measuring an offset voltage at said diagnostic node when said at least one first controllable switching element is in said closed state and subtracting said offset voltage from said variation of said voltage level at said diagnostic node prior to the comparison with said threshold value.

BRIEF DESCRIPTION OF THE DRAWINGS

Further details and advantages of the present invention will be apparent from the following detailed description of a not limiting embodiment with reference to the attached FIG. 1 which is a schematic circuit diagram of a combined heater and capacitive sensor device according to a preferred embodiment of the invention.

DESCRIPTION OF PREFERRED EMBODIMENTS

FIG. 1 shows a combined heater and capacitive sensor device according to a preferred embodiment of the invention.

The combined heater and capacitive sensor device comprises an ohmic heating element 4, e.g. a seat heater or a steering wheel heating element, which produces heat when traversed by an electrical current. The heating element 4 is connected to a heating current source 1 (e.g. a car battery) via the first and second windings of a common mode choke 3. The heating current source or electrical power supply 1 supplies the heating current for the heating element 4. Switch 2 switches the heater element heating current on and off and for instance allows a user to switch the heater on and off.

The heating element 4 furthermore serves as an antenna electrode of a capacitive sensor. During capacitive sensing, the common mode choke 3 separates the heating current from the measurement current. Complex impedances 5 and 6 represent the impedance between heating element 4 and electrical ground, and are typically a combination of resistances and capacitances. In the case of a seat occupancy sensor these impedances depend on the occupancy state of the seat, in the case of a hands-on detection sensor for a steering wheel, the impedances depend on the proximity of a driver's hand or hands to the sensor in the steering wheel.

The capacitive measurement is implemented by AC signal source 8 and transimpedance amplifier 7. An AC signal source 8 generates an AC voltage, preferably a sine wave with a frequency between 10 kHz and 350 kHz, and injects this signal into the lower, reference input of transimpedance amplifier 7. Due to the action of the transimpedance amplifier 7, the signal on the upper input of transimpedance amplifier 7 has substantially the same AC voltage than the transimpedance amplifier's reference input.

During the capacitive measurement, switch 13 is open, and the AC current through the paralleled impedances 5 and 6 will also flow through capacitor 20 into the signal input of transimpedance amplifier 7. Capacitor 20 is for instance chosen such that its impedance at the operating frequency of AC source 8 is preferably substantially lower than the input impedance of transimpedance amplifier 7. As the output 9 of transimpedance amplifier 7 is indicative of the current at its signal input, the output 9 will also be indicative of the paralleled impedances 5 and 6.

During the seat heater diagnostics, a DC current 17 flows into the first winding of common mode choke 3 either because switch 2 is closed during the heating period, or, during the heating pauses, because switch 11 is closed. DC voltage source 12 and resistance 10 inject a current into the first winding of common mode choke 3 during heating pauses.

The purpose is to allow a current 17 to flow during seat heater diagnostics, irrespective whether the heating current is flowing, even if the current is not constant. It should be noted that voltage source 12 could be permanently connected to the first winding of the common mode choke. However in a preferred embodiment the voltage source 12 is preferably connectable via a controllable switch 11 to the first winding.

Switch 13 is first closed when the seat heater diagnostics is started. Current 17 flows through the first winding of common mode choke 3, through seat heater 4, and divides between currents 18 and 19, current 18 flowing through the second winding of common mode choke 3, and current 19 flowing through closed switch 13.

As the magnetic coupling factor between first and second windings is large, typically larger than 0.95, the current 18 will first be equal to current 17 the first time current 17 is switched on by switches 2 or 11, due to the transformer action of common mode choke 3. The windings of common mode choke 3 have an inductance, for example 10 mH, and a DC resistance, for example 10 mΩ per winding. Switch 13 also has an 'on' resistance, of 10 mΩ for example.

As the inductance of the common mode choke windings is not infinite, current 18 will decay in time, and current 19 will rise correspondingly, such that the sum of currents 18 and 19 remains substantially equal to current 17.

After a settling time, the repartition of current 17 between currents 18 and 19 will be defined by the ratios of second winding DC resistance and switch 13 'on' resistance. In the example above both currents will be equal as both resistances are equal.

Switch 13 is opened after a delay after its closure, for example after 100 ms. As current 19 now drops abruptly to a level of substantially zero, current 18 is abruptly jumping from its previous level to the level of current 17. This current step through the second winding generates a voltage pulse on node 14, which is e.g. amplified by amplifier 15 and routed into the analog to digital input 16 of a microcontroller 21.

A part of the changes in currents 18 and 19 will also be absorbed by the parallel connection of the parasitic capacitance of common mode choke 17, the impedances 5 and 6, and the series connection of capacitor 20 and input impedance of transimpedance amplifier 7. This will lead to an attenuation of the pulse and a decaying oscillation instead of a single pulse on node 14. Both effects however do not play a substantial role in the diagnostics operation.

The microcontroller 21 also preferably controls switches 11 and 13, e.g. via one or more control line(s) 22.

The microcontroller compares the size of the pulse on the analog to digital converter input 16 to a predetermined value. If current 17 is not allowed to flow due to a disconnected or broken (open circuit) seat heater, the pulse on analog to digital input 16 will be below said threshold, and the microcontroller will recognize a defective heater element. In the opposite case, the heater element is considered to be operational.

Additionally, the microcontroller preferably measures the offset voltage at output of amplifier 15 during stable conditions when no voltage variation occurs due to the switch opening and later subtracts this offset from the measured pulse before doing the comparison. The offset voltage is for instance measured during the time switch 13 is on and switches 2 and/or 11 are on.

The invention claimed is:

1. A capacitive occupancy or proximity detector, comprising:
   a heating circuit including a heating element, a heating current source and a common mode choke having a first and a second winding, said heating element being connectable to said heating current source via said first and second windings of said common mode choke;
   an impedance measurement circuit connected to said heating element for measuring impedance between said heating element and a node at ground potential; and
   a diagnostic circuit configured for determining integrity of said heater element,
   wherein said diagnostic circuit comprises:
   at least one first controllable switching element having a first terminal connected to said second winding of said common mode choke, and a second terminal connected to ground potential, such that said at least one first controllable switching element is coupled across said second winding of said common mode choke;
   means for injecting a DC current into a series connection formed by said first winding of said common mode choke, said heating element and a parallel connection of said second winding of said common mode choke and said at least one first controllable switching element, wherein the injected DC current flows through said first winding, through said heating element, and divides at the parallel connection such that part of the injected DC current flows through said second winding, and another part of the injected DC current flows through said at least one first controllable switching element; and
   at least one detection circuit for detecting a voltage variation across said second winding of said common mode choke, said voltage variation being induced upon opening said first controllable switching element.

2. The capacitive occupancy or proximity detector according to claim 1, wherein said means for injecting said DC current comprises said heating current source and wherein said diagnostic circuit is configured for determining integrity of said heater element during a heating cycle of said heating element.

3. The capacitive occupancy or proximity detector according to claim 1, wherein said means for injecting said DC current comprises a diagnostic DC current source which is connected to said first winding of said common mode choke and wherein said diagnostic circuit is configured for determining integrity of said heater element outside a heating cycle of said heating element.

4. The capacitive occupancy or proximity detector according to claim 1, wherein said means for injecting said DC current comprises a diagnostic DC current source which is connectable via a second controllable switching element to said first winding of said common mode choke and wherein said diagnostic circuit is configured for determining integrity of said heater element outside a heating cycle of said heating element.

5. The capacitive occupancy or proximity detector according to claim 1, wherein said detection circuit comprises a microcontroller comprising an analog to digital conversion block and a corresponding analog to digital input, said analog to digital input being operatively connected to a diagnostic node located between said second winding of said common mode choke and said heating element, said microcontroller being further configured for comparing an amplitude of said voltage variation at said diagnostic node to a threshold value.

6. The capacitive occupancy or proximity detector according to claim 5, wherein said detection circuit further comprises an amplifier connected between said diagnostic node and said analog to digital input of said microcontroller, said amplifier for amplifying a voltage signal at said diagnostic node.

7. The capacitive occupancy or proximity detector according to claim 5, wherein said microcontroller is further configured for measuring an offset voltage at said analog to digital input and for subtracting the measured offset voltage from said voltage variation prior to the comparison with said threshold value.

8. The capacitive occupancy or proximity detector according to claim 7, wherein said microcontroller is configured for measuring said offset voltage at said analog to digital input when said first controllable switching element is closed.

9. The capacitive occupancy or proximity detector according to claim 5, wherein said microcontroller is further configured for controlling operation of said at least one first controllable switching element and/or at least one second controllable switching element.

10. Method for determining integrity of a heater element in a capacitive occupancy or proximity detector according to claim 1, said method comprising the steps of:
  a. controlling said at least one first controllable switching element to switch into a closed state;
  b. causing a DC current to be injected into a series connection formed by said first winding of said common mode choke, said heating element and a parallel connection of said second winding of said common mode choke and said at least one first controllable switching element;
  c. after a predetermined settling time, controlling said at least one first controllable switching element to switch into an open state;
  d. upon opening said first controllable switching element, detecting a voltage variation across said second winding of said common mode choke; and
  e. concluding that integrity of a heater element is given if said voltage variation exceeds a predetermined threshold value.

11. Method for determining integrity of a heater element according to claim 10, wherein said causing said DC current to be injected into a series connection comprises causing said heating current source to supply a heating current to said heating element.

12. Method for determining integrity of a heater element according to claim 10, wherein said causing said DC current to be injected into a series connection comprises connecting a diagnostic DC current source to said first winding of said common mode choke.

13. Method for determining integrity of a heater element according to claim 10, wherein said detecting a voltage variation across said second winding of said common mode choke comprises detecting a variation of a voltage level at a diagnostic node located between said second winding of said common mode choke and said heating element, and wherein said method further comprises the step of measuring an offset voltage at said diagnostic node and subtracting said offset voltage from said variation of said voltage level at said diagnostic node prior to the comparison with said threshold value.

14. Method for determining integrity of a heater element according to claim 13, wherein said measuring an offset voltage is carried out when said at least one first controllable switching element is in said closed state.

\* \* \* \* \*